United States Patent [19]
Li et al.

[11] Patent Number: 6,066,564
[45] Date of Patent: May 23, 2000

[54] INDIRECT ENDPOINT DETECTION BY CHEMICAL REACTION

[75] Inventors: Leping Li, Poughkeepsie, N.Y.; James Albert Gilhooly, Saint Albans; Clifford Owen Morgan, III, Burlington, both of Vt.; Cong Wei, Poughkeepsie; Chienfan Yu, Highland Mills, both of N.Y.

[73] Assignee: International Business Machines Corporation, Armonk, N.Y.

[21] Appl. No.: 09/073,605

[22] Filed: May 6, 1998

[51] Int. Cl.⁷ .................................................. H01L 21/302
[52] U.S. Cl. .......................................... 438/692; 438/693
[58] Field of Search .................... 438/690, 691, 438/692, 693, 700, 701, 706, 5, 14; 156/345; 216/84, 88

[56] References Cited

U.S. PATENT DOCUMENTS

| | | | |
|---|---|---|---|
| 3,503,711 | 3/1970 | Skala | 23/232 |
| 3,904,371 | 9/1975 | Neti et al. | 23/232 |
| 4,493,745 | 1/1985 | Chen et al. | 156/626 |
| 4,512,964 | 4/1985 | Vayenas | 423/403 |
| 4,812,416 | 3/1989 | Hewig et al. | 437/5 |
| 4,961,834 | 10/1990 | Kuhn et al. | 204/412 |
| 4,975,141 | 12/1990 | Greco et al. | 156/626 |
| 5,234,567 | 8/1993 | Hobbs et al. | 204/415 |
| 5,242,532 | 9/1993 | Cain | 156/626 |
| 5,242,882 | 9/1993 | Campbell | 502/325 |
| 5,256,387 | 10/1993 | Campbell | 423/392 |
| 5,395,589 | 3/1995 | Nacson | 422/88 |
| 5,399,234 | 3/1995 | Yu et al. | 156/636 |
| 5,405,488 | 4/1995 | Dimitrelis et al. | 156/627 |
| 5,439,551 | 8/1995 | Meikle et al. | 156/626 |
| 5,449,314 | 9/1995 | Meikle et al. | 438/692 |
| 5,559,428 | 9/1996 | Li et al. | 324/71.5 |
| 5,647,952 | 7/1997 | Chen | 156/636.1 |
| 5,736,462 | 4/1998 | Takabashi et al. | 438/700 |
| 5,795,495 | 8/1998 | Meikle | 216/88 |
| 5,836,805 | 11/1998 | Obeng | 451/36 |

FOREIGN PATENT DOCUMENTS 3-277947  12/1991  Japan .............................. G01N 21/77

OTHER PUBLICATIONS

Biolsi, et al, "An Advanced Endpoint Detection Solution for <1% Open Areas", Solid State Technology, Dec. 1996, pp. 59–67.

Economou, et al, "In Situ Monitoring of Etching Uniformity in Plasma Reactors", Solid State Technology, Apr., 1991, pp. 107–111.

Roland, et al, "Endpoint Detecting in Plasma Etching", J. Vac. Sci. Technol. A3(3), May/Jun. 1985, pp. 631–636.

Park, et al, "Real Time Monitoring of NH, Concentration Using Diffusion Scrubber Sampling Technique and Result of Application to the Processing of Chemiacally Amplified Resists", Jpn. J. Appl. Phys. vol. 34 (1995) pp. 6770–6773 Part 1 No. 12B, Dec., 1995.

Carr, et al, Technical Disclosure Bulletin, "End–Point Detection of Chemical/Mechanical Polishing of Circuitized Multilayer Substrates", YO887–0456, vol. 34 No. 4B, Sep. 1991 pp. 406–407.

Carr, et al, Technical Disclosure Bulletin, "End–Point Detection of Chemical/Mechanical Polishing of Thin Film Structures", YO886–0830, vol. 34 No. 4A, Sep. 1991, pp. 198–200.

Rutten, Research Diclosure Endpoint Detection Method for Ion Etching of Material Having a Titaniun Nitride Underlayer, BU890–0132, Feb. 1991, No. 322, Kenneth Mason Publications Ltd, England.

*Primary Examiner*—Felisa Hiteshew
*Assistant Examiner*—Duy-Vu Deo
*Attorney, Agent, or Firm*—Alison D. Mortinger; Jay H. Anderson

[57] ABSTRACT

Detection of the endpoint for removal of a target film overlying a stopping film by removing the target film with a process that selectively generates a chemical reaction product (for example ammonia when polishing a wafer with a nitride film in a slurry containing KOH) with one of the stopping film and the target film, converting the chemical reaction product to a separate product, and monitoring the level of the separate product as the target film is removed.

15 Claims, 5 Drawing Sheets

INDIRECT ENDPOINT DETECTION BY CHEMICAL REACTION

RELATED APPLICATIONS

This invention is related to the following copending U.S. Patent applications:

Ser. No. 09/073601, Attorney Docket BU9-97-098, entitled "Endpoint Detection by Chemical Reaction and Light Scattering";

Ser. No. 09/073602, Attorney Docket BU9-97-100, entitled "Endpoint Detection by Chemical Reaction";

Ser. No. 09/073607, Attorney Docket FI9-98-050, entitled "Endpoint Detection by Chemical Reaction and Reagent";

Ser. No. 09/073603, Attorney Docket FI9-98-061, entitled "Reduction of a Gaseous Product in Solution";

Ser. No. 09/073604, Attorney Docket FI9-98-062, entitled "Indirect Endpoint Detection by Chemical Reaction and Chemiluminescence"; and Ser. No. 09/073606, Attorney Docket FI9-98-067, entitled "Endpoint Detection by Chemical Reaction and Photoionization" all filed on the same day, all assigned to the present assignee, and all incorporated by reference in their entireties.

FIELD OF THE INVENTION

This invention is directed to semiconductor processing and more particularly to the detection of the endpoint for removal of one film overlying another film.

BACKGROUND OF THE INVENTION

In the semiconductor industry, critical steps in the production of integrated circuits are the selective formation and removal of films on an underlying substrate. The films are made from a variety of substances, and can be conductive (for example metal or a magnetic ferrous conductive material) or non-conductive (for example an insulator). Conductive films are typically used for wiring or wiring connections. Non-conductive or dielectric films are used in several areas, for example as interlevel dielectrics between layers of metallization, or as isolations between adjacent circuit elements.

Typical processing steps involve: (1) depositing a film, (2) patterning areas of the film using lithography and etching, (3) depositing a film which fills the etched areas, and (4) planarizing the structure by etching or chemical-mechanical polishing (CMP). Films are formed on a substrate by a variety of well-known methods, for example physical vapor deposition (PVD) by sputtering or evaporation, chemical vapor deposition (CVD), plasma enhanced chemical vapor deposition (PECVD). Films are removed by any of several well-known methods, for example chemical-mechanical polishing (also known as CMP), dry etching such as reactive ion etching (RIE), wet etching, electrochemical etching, vapor etching, and spray etching.

It is extremely important with removal of films to stop the process when the correct thickness has been removed (the endpoint has been reached). With CMP, a film is selectively removed from a semiconductor wafer by rotating the wafer against a polishing pad (or rotating the pad against the wafer, or both) with a controlled amount of pressure in the presence of a slurry. Overpolishing (removing too much) of a films results in yield loss, and underpolishing (removing too little) requires costly rework (redoing the CMP process). Various methods have been employed to detect when the desired endpoint for removal has been reached, and the polishing should be stopped.

The prior art methods for CMP endpoint detection suitable for all types of films involve the following types of measurement: (1) simple timing, (2) friction by motor current, (3) capacitive, (4) optical, (5) acoustical, and (6) conductive.

An exception to the above is U.S. Pat. No. 5,399,234 to Yu et al, in which a chemical reaction is described between potassium hydroxide in the polishing slurry and the layer being polished. The endpoint for polishing is monitored by sending acoustic waves through the slurry and detecting changes in the acoustic velocity as the concentration of reaction product (thought to be silanol in the case of polishing silicon dioxide) from the layer being polished decreases upon reaching an underlying polish stop layer.

These prior art methods each have inherent disadvantages such as inability for real-time monitoring, the need to remove the wafer from the process apparatus for examining the completion of polishing (not in-situ), or a lack of sensitivity.

These disadvantages have been overcome with an in-situ endpoint detection scheme for conductive films as described in U.S. Pat. No. 5,559,428 to Li et al titled "In-Situ Monitoring of the Change in Thickness of Films," however a suitable endpoint detection for non-conductive films has yet to be described.

Thus, there remains a need for an in-situ, real-time endpoint detection scheme suitable for use with all types of films. Such a scheme should have high detection sensitivity and extremely fast response time, preferably less than 1 or 2 seconds.

SUMMARY OF THE INVENTION

It is therefore an object of the present invention to provide a method and apparatus for detecting the endpoint for removal of any type of film overlying another film.

Another object of the present invention is to provide for in-situ endpoint detection as the film is being removed.

Yet another object is to provide endpoint detection with high detection sensitivity and extremely fast response time.

In accordance with the above listed and other objects, a method for detecting the endpoint for removal of a target film overlying a stopping film by (a) removing the target film with a process that selectively generates a chemical reaction product with one of the stopping film and the target film; (b) converting the chemical reaction product to a separate product; and (c) monitoring the level of the separate product as the target film is removed is described. A method for detecting the endpoint for removal of a target film overlying a stopping film, one of the target film and the stopping film including nitride, by (a) removing the target film with a process that generates ammonia upon exposing the nitride to the process; (b) converting the ammonia to a separate product; and (c) monitoring the level of ammonia as the target film is removed is also described.

DESCRIPTION OF THE DRAWINGS

These and other features, aspects, and advantages will be more readily apparent and better understood from the following detailed description of the invention, in which.

DESCRIPTION OF THE PREFERRED EMBODIMENTS

The present invention is described herein in the context of chemical-mechanical polishing merely as a specific example, and is not meant to limit applicability of the invention to semiconductor technology. Those skilled in the art will understand that the invention is broadly applicable to any process in which it is desirable to detect the endpoint for removal of a target film overlying a stopping film by (a) removing the target film with a process that selectively generates a chemical reaction product with one of the stopping film and the target film; (b) converting the chemical reaction product present to a separate product; and (c) monitoring the level of the separate product as the target film is removed. The invention is also broadly applicable to any process in which it is desirable to detect the endpoint for removal of a target film overlying a stopping film, one of the target film and the stopping film including nitride, by (a) removing the target film with a process that generates ammonia upon exposing the nitride to the process; (b) converting the ammonia present to a separate product; and (c) monitoring the level of ammonia as the target film is removed.

Figure 1:
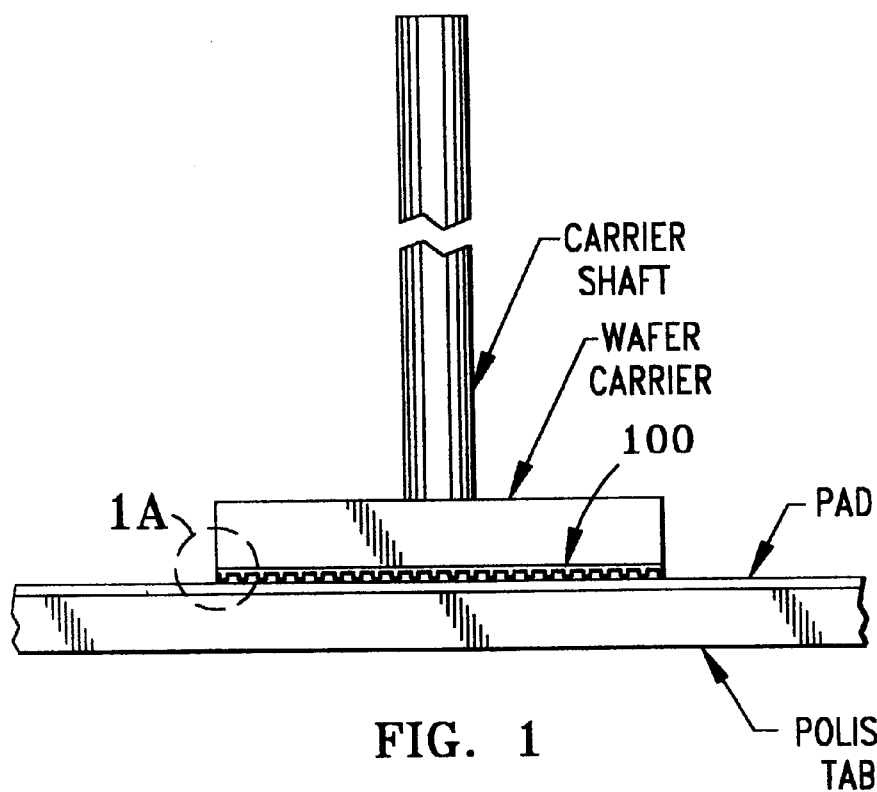
FIG. 1 shows a cross-section of a target film to be chemically-mechanically polished.
Figure 1A:
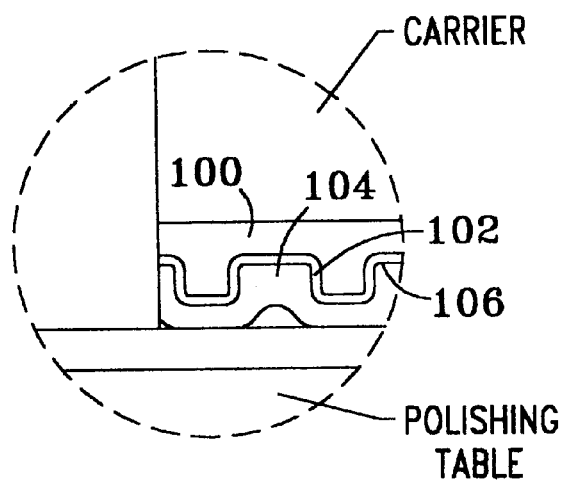

As shown in FIG. 1, we have discovered that when chemically-mechanically polishing a substrate 100 with a target film of oxide ($SiO_2$) 104 over a stopping film of nitride ($Si_3N_4$) 102 with a slurry containing potassium hydroxide (KOH), a chemical reaction occurs when the interface 106 is reached, resulting in the production of ammonia ($NH_3$). More specifically, the slurry used is a mixture of fumed silica, water, and KOH, with a pH of about 10.5. When polishing oxide, the following reaction occurs:

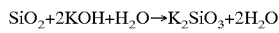

When polishing nitride, the following reaction occurs:

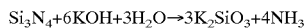

The ammonia produced is dissolved in the slurry, and because of the relatively high pH it exists primarily in the form of $NH_3$ rather than $NH_4^+$. Thus the change in the level ammonia in the slurry indicates that the underlying nitride film has been reached, and the endpoint for removal of the oxide film can be determined by monitoring the level of ammonia in the slurry. Once the endpoint is reached, the polishing is stopped.

More generally, the endpoint for removal of any non-nitride-containing film overlying a nitride-containing film can be detected by monitoring the level of ammonia in the slurry. Conversely, the endpoint for removal of a nitride-containing film overlying a non-nitride-containing film can also be detected in a similar manner, with a marked decrease in the presence of ammonia indicating the endpoint.

Even more generally, the endpoint for removal of any film overlying another film can be detected by monitoring the level of a chemical reaction product in the slurry as a component of the slurry reacts selectively with one of the films (either the overlying or underlying film). The reaction described above producing ammonia will be discussed as follows but is not intended to limit the scope of the invention to that particular embodiment. In order to implement the above discovery concerning the production of ammonia in an environment suitable for manufacturing, in-situ (i.e. while the wafer is being polished) slurry collection and sampling is required. Preferably, the collection and sampling provide a rapid response with high sensitivity (to ammonia) and minimizes the effect of interference from other substances in the slurry and in the surrounding air.

Unfortunately, the slurry described above already contains ammonia prior to being used for polishing. The ammonia concentration varies from as low as $5.0 \times 10^{-6}$ M to as high as $5.0 \times 10^{-5}$ M. The ammonia produced in the slurry when polishing a blanket (i.e. uniform) layer of nitride is approximately $1.0 \times 10^{-4}$ M at room temperature; for a typical low pattern factor production wafer having a nitride layer which covers 15% of the wafer area (the rest being oxide), polishing at the interface of the oxide/(oxide+nitride) produces $1.5 \times 10^{-5}$ M. The desired concentration change to be measured will not be able to be distinguished from the fluctuation in the pre-polish ammonia concentration during polishing. Therefore the ammonia concentration prior to polishing must be reduced in order to achieve the desired sensitivity.

Figure 2:
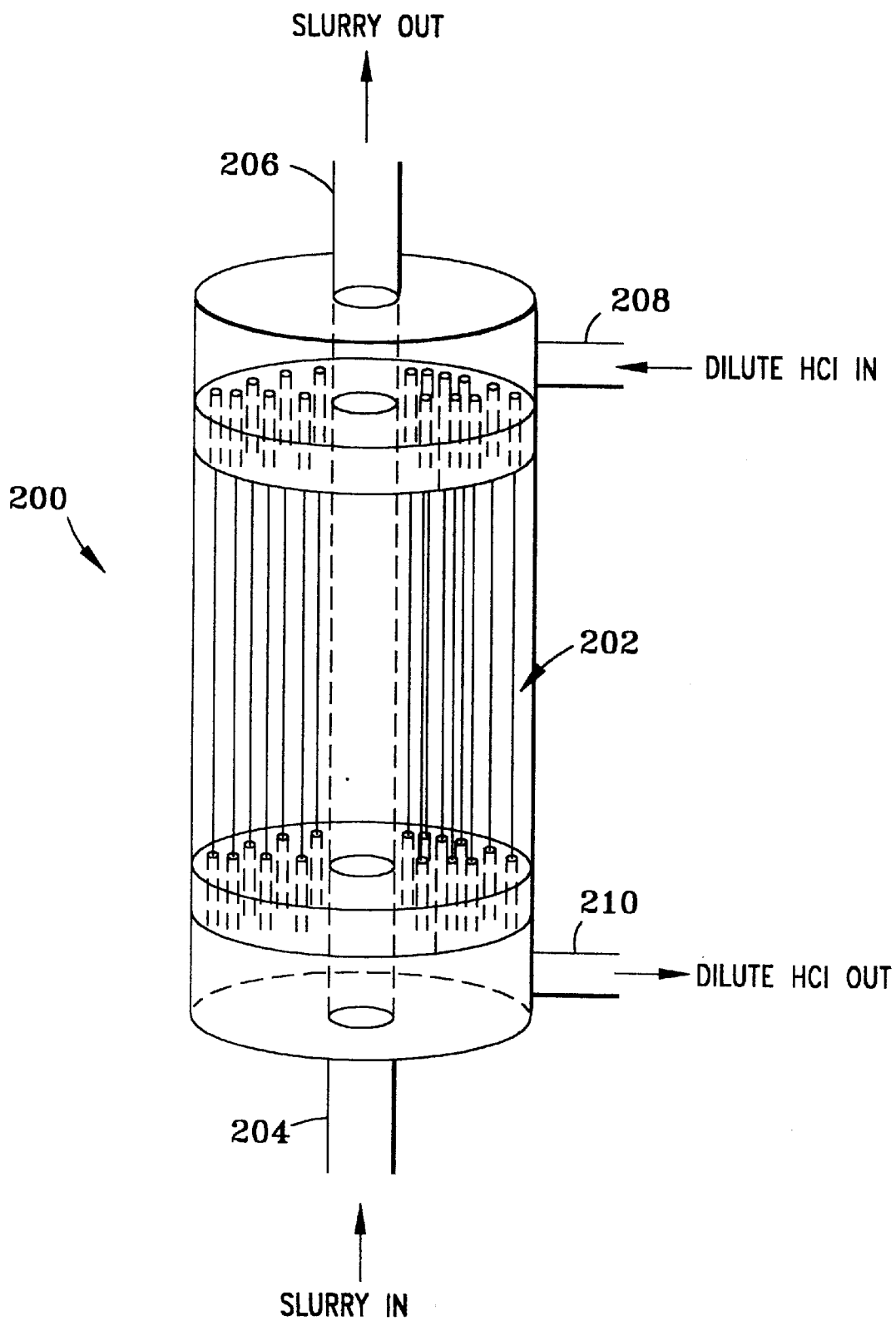
FIG. 2 shows a cross-section of an ammonia scrubber for reducing pre-polish ammonia concentration in the slurry.

The reduction in pre-polish ammonia concentration is achieved by using an ammonia scrubber, resulting in a concentration of approximately $2.5 \times 10^{-6}$ M. The main component of the scrubber is a Liqui-Cel Membrane Contactor 200 (model Extra-Flow 4×28 made by Hoechst Celanese) shown in FIG. 2. The Contactor contains Celgard (TM) microporous polypropylene fibers 202 which are hydrophobic and do not allow water-based solutions to penetrate through the fiber membranes, but do allow gas exchange.

Slurry from a reservoir enters contactor 200 at 204 and flows through contactor 200 on the outside of the fibers (also called shellside) allowing ammonia to permeate to the inside of the fibers (also called lumenside) before exiting at 206 and recirculating back to 204. To facilitate removal of the ammonia in the slurry, an aqueous HCl solution from another reservoir with a pH of approximately 3 is circulated in the lumenside, entering at 208 and exiting at 210 before recirculating back to 208. Ammonia gas from the slurry crossing into this HCl stream is immediately converted to $NH_4^+$ by a moderately high concentration of protons, therefore effectively preventing a possible buildup of any appreciable amount of $NH_3$ in the lumenside of the scrubber. The recirculating aqueous HCl stream and reservoir can then be the sink for a large amount of ammonia from the slurry.

With an aqueous HCl reservoir of approximately 10 liters of water adjusted to a pH of 3.5 using 0.1 M HCl solution, and 10 liters of $1.0 \times 10^{-4}$ M ammonia solution at a pH of 10.7 passing through the above-described contactor, the ammonia level was reduced to the desired $2.5 \times 10^{-6}$ M in 30 minutes. The time can be reduced by increasing the size of the contactor, using several contactors in series, or gently heating the slurry to increase the volatility of the ammonia, or any combination of the three. The desired target ammonia level in the slurry can be measured by a commercially available detector such as an ammonia specific ion selective electrode (ISE).

Once the slurry has reached the desired target ammonia level, it is used to polish a wafer. The slurry is collected from the polishing pad for sampling during the polishing process.

Extraction of Ammonia Gas from the Slurry

Figure 3:
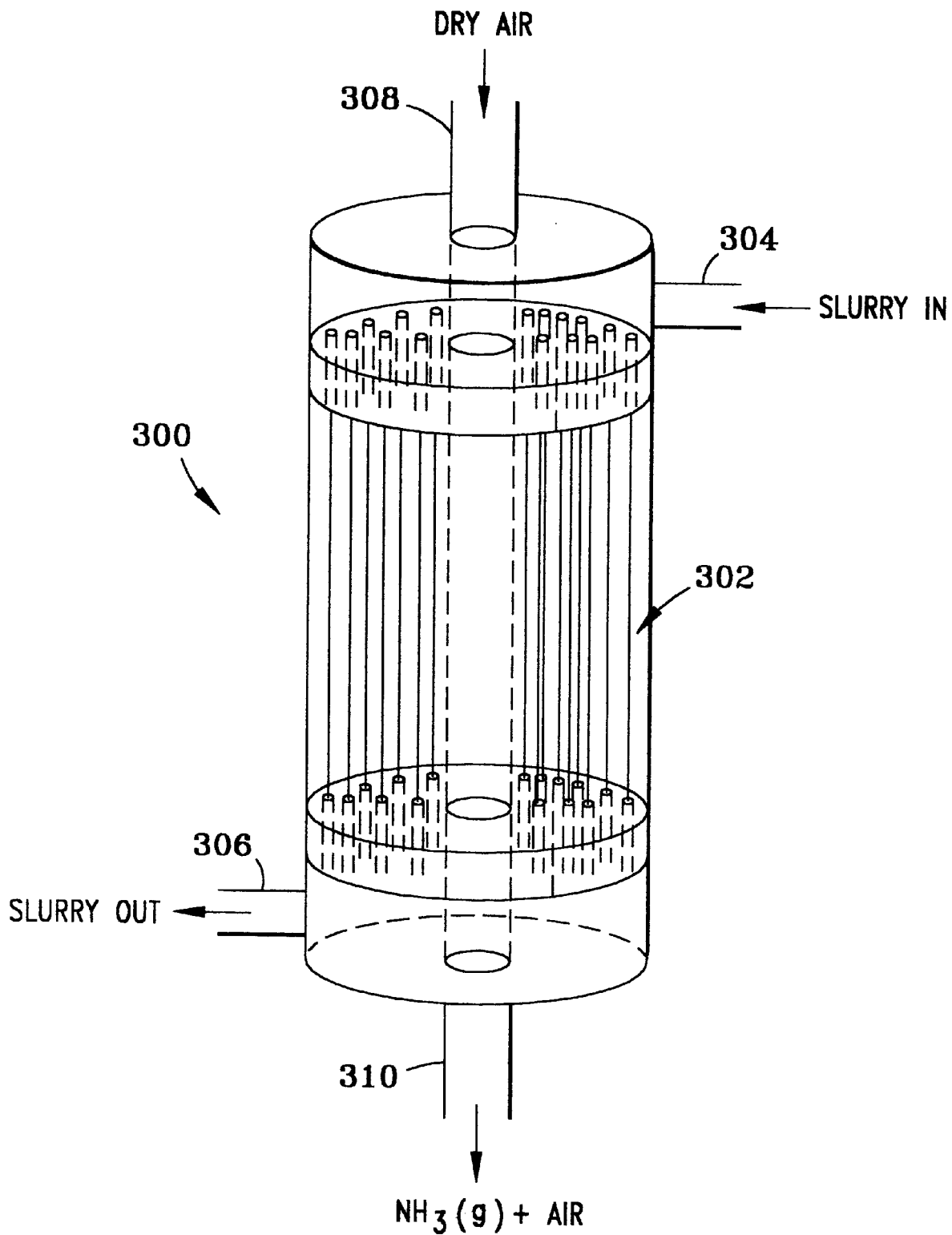
FIG. 3 shows a cross-section of an extraction unit for extracting ammonia gas from the slurry.

In order to detect and monitor ammonia in a gaseous form, thus enabling methods such as mass spectroscopy, slurry from the polishing apparatus (not shown) is pumped through an ammonia extraction unit 300 shown in FIG. 3. Extraction unit 300 is constructed from polypropylene microporous hollow fibers 302 obtained from a dismantled Liqui-Cel Contactor (model 2.5×8 made by Hoechst Celanese). Fibers 302 allow gas but not liquid to pass from the outside to the inside of the fibers.

Slurry is pumped in at 304 through extraction unit 300 on the outside of fibers 302 and exits at 306. Dry and clean gas (from a drier containing an ammonia filter and a $deNO_x$ filter) is pumped in at 308 through the inside of the fibers and exits as stream 312 containing ammonia gas at 310. The carrier gas is pumped at a reduced pressure of approximately 30 Torr to facilitate ammonia transport from the slurry through the fibers and into the gas stream. The reduced pressure also increases the overall flow velocity, which helps to reduce the response time for measuring the change in ammonia concentration.

The ammonia-containing gas stream 312 from extractor 300 can then be analyzed and monitored for endpoint detection for removal of the target film. Gas phase chemical analysis, such as standard mass spectroscopy can be highly sensitive and have a fast response time, which would be desirable for endpoint detection. However, with slurry sampling, there is substantial interference from water vapor which is only 1 atomic mass unit (AMU) higher and present in abundance. During the electron impact ionization, water of mass 18 can lose a hydrogen resulting in a OH ion with mass 17, which has a mass identical to $NH3^+$. Thus the ammonia signal from the slurry can be very effectively masked, and endpoint detection becomes impossible.

Conversion to Nitric Oxide

Figure 4:
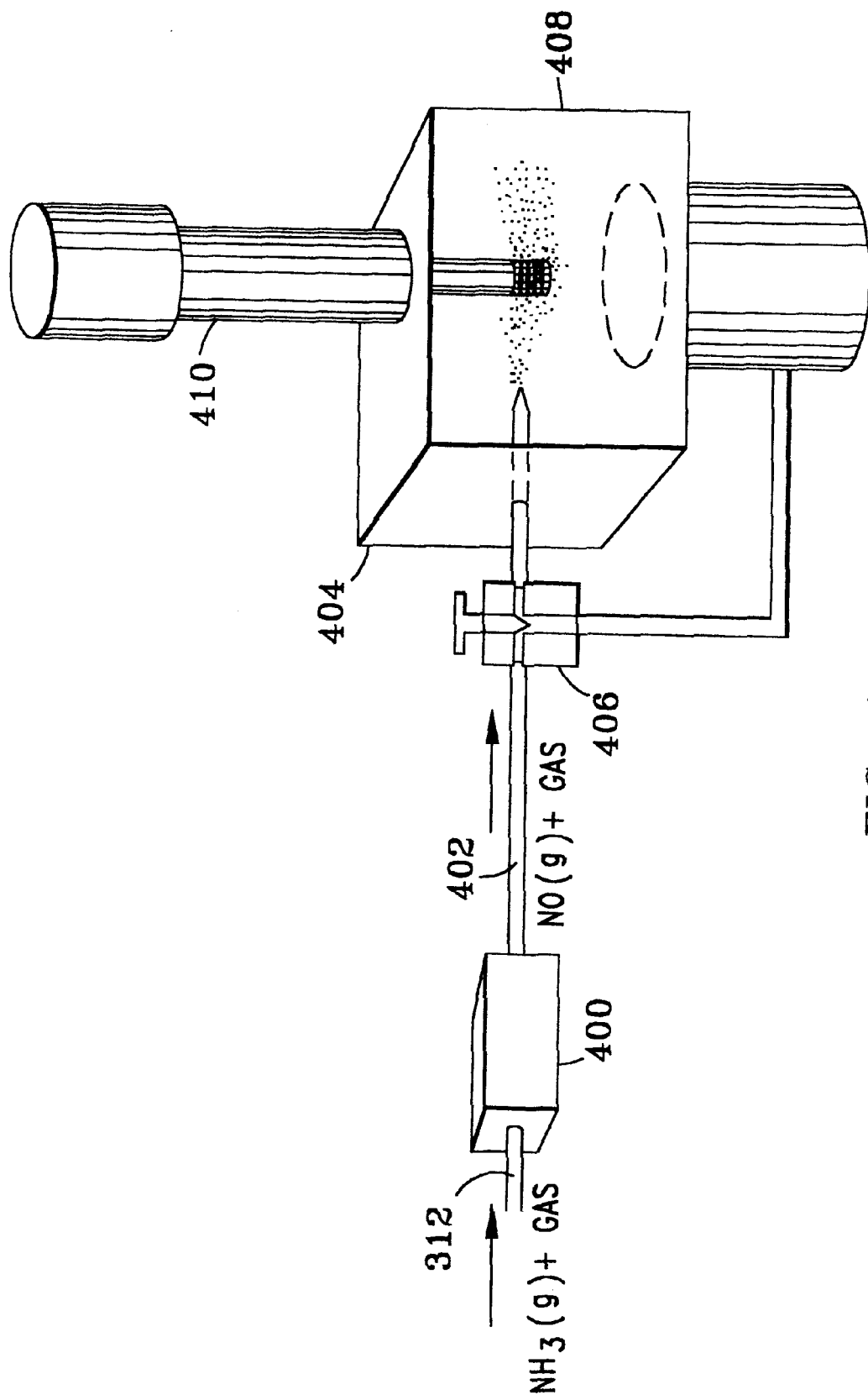
FIG. 4 shows the setup for converting ammonia gas to NO and detection using mass spectroscopy.

The interference of the water fragment OH can be circumvented by converting the ammonia in the ammonia-containing gas stream from the extraction unit 300 (shown in FIG. 3) to a separate product which has a different mass than OH, and indirectly detecting the ammonia by detecting the separate product. An example is converting the ammonia to nitric oxide (NO) using a catalytic converter, as shown in FIG. 4.

Ammonia-containing gas stream 312 enters catalytic converter 400, for example an array of stainless steel tubing having a sufficiently large surface area for a sufficient amount of gas to be converted which is heated to 800 C. The conversion, known as the Oswald process, is described by the reaction

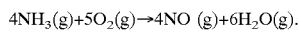

$$4NH_3(g)+5O_2(g)\rightarrow 4NO\ (g)+6H_2O(g).$$

Note that the carrier gas for the stream entering the converter preferably contains oxygen ($O_2$) but not air, because air contains nitrogen isotope $(_7N^{15})_2$ at approximately 15 ppm and at mass 30, which is the same mass as NO.

Mass Spectroscopy

Gas stream 402 exiting converter 400 contains NO and enters mass spectrometer system 404. A bypass valve 406 is used to regulate the flow of the stream, and allows a substantial overall flow through extraction unit 300 and catalytic converter 400 resulting in a rapid measurement response time without overloading spectrometer 404 with sampling gas from the incoming NO-containing gas stream. Mass spectrometer system 404 consists of vacuum chamber 408 containing a quadrupole mass analyzer with an electron impact ionization source 410 such as Stanford Research Systems Residual Gas Analyzer model RGA200. This spectrometer has a dynamic range of eight orders of magnitude and would detect NO down to a level of approximately 10 ppb. The spectrometer is gated to detect ions only at mass/charge 30 and the signal can be acquired by a computer for real-time monitoring.

Rempi-TOF Mass Spectroscopy

Figure 5:
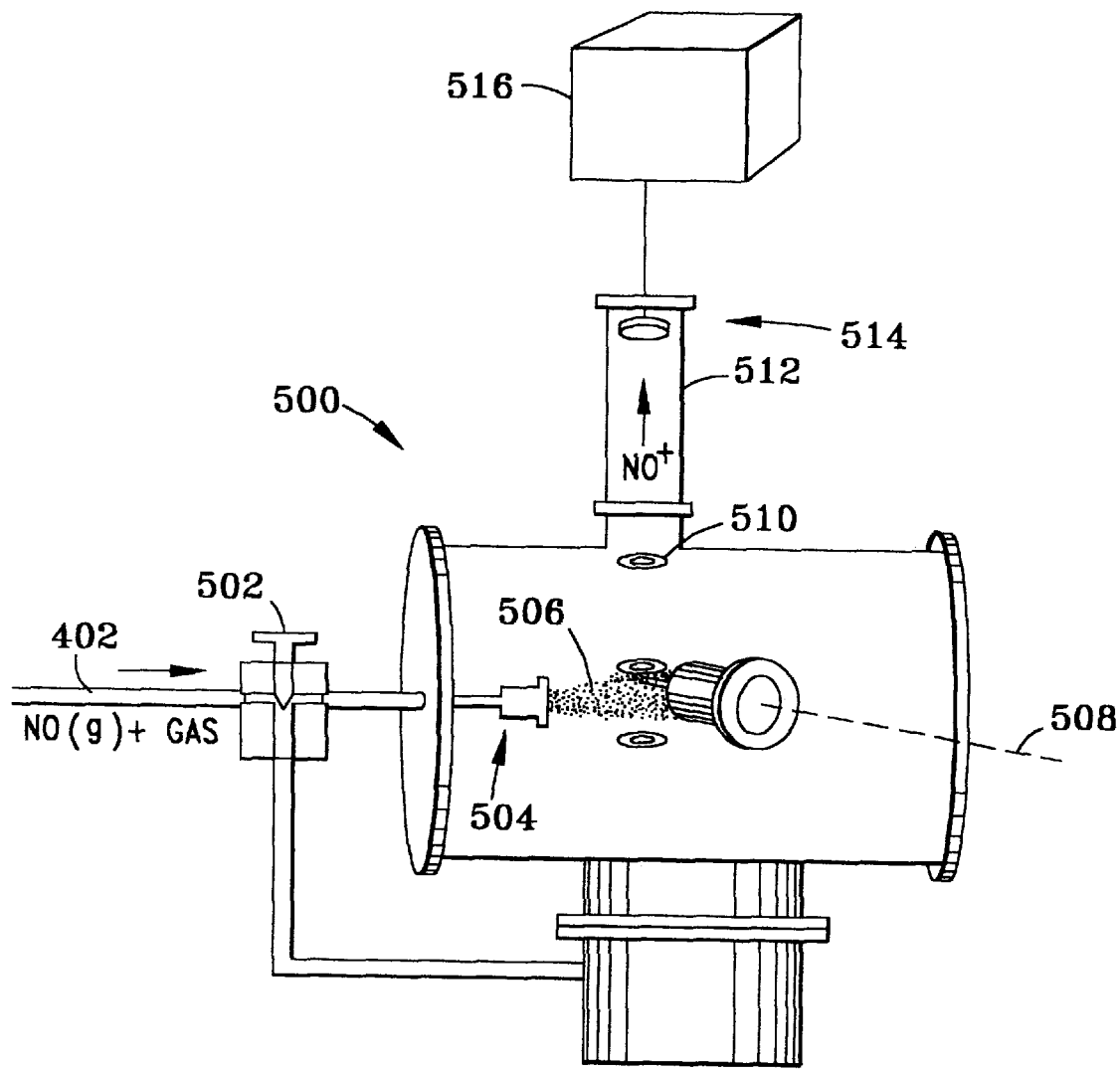
FIG. 5 shows the setup for NO sampling using resonance-enhanced multiphoton ionization spectroscopy; all in accordance with the present invention.

An alternate method to mass spectroscopy is resonance-enhanced muliphoton ionization (REMPI) spectroscopy, which has been shown to easily and sensitively detect the presence of nitric oxide. (See D. C. Jacobs et al, "Reduction of 1+1 Resonance Enhanced MPI Spectra to Population Distributions: Application to the NO $A^2\Sigma^+-X^2\Pi$ System," J. Chem. Phys. Vol. 85 page 5469 (1986). In FIG. 5, NO containing gas stream 402 exiting converter 400 enters a time-of-flight (TOF) mass spectrometer 500 through a bypass valve 502 similar to that previously described above. A pulsed molecular beam valve 504 converts stream 402 to a pulsed stream 506. The pressure of gas stream 402 is approximately 30 Torr which is sufficient to form a beam but not necessarily a cold supersonic expansion upon entering the chamber of the spectrometer.

Pulsed valve 504 is timed to coordinate with a pulsed laser beam 508 which selectively ionizes the NO from pulsed gas stream 506. Laser beam 508 can be for example the output of a laser system with a frequency doubled Q-switch Nd:YAG laser operating at 20 Hz used to pump a titanium sapphire (Ti:S) tunable laser. The Ti:S laser is tuned to 904 nm, and its output is frequency doubled twice using BBO nonlinear crystals. The second harmonic is at 452 nm and the fourth harmonic is at the desired wavelength of 226 nm, or that of a one-photon excitation of NO from ground state. The ionization scheme described has shown to be extremely efficient with a total detection sensitivity down to $1.0\times 10^{-11}$ Torr. (See M. Asscher et al., "Vibrational and Rotational Energy Distribution of NO Scattered from the Pt(111) Crystal Surface: Detection by Two-Photon Ionization," Phys. Rev. Lett. Vol. 49 page 76 (1982).)

Pulsed ionized gas stream 506 then is accelerated by fields created using electrodes 510. The ions travel the length of a drift tube 512 to a detector 514. The travel time of the ions is proportional to their mass and so a time gating of the arrival signal is used to measure only the signal from the NO. The resulting signal is averaged in a Boxcar averager 516 (from Stanford Systems, Model SR250) and directed to a computer for processing (not shown). Based on static gas measurements, this technique is expected to have a sensitivity of 10 ppb with a response time of a few seconds.

In summary, a method and associated apparatus have been described which are capable of detecting the endpoint for removal of any type of film overlying another film. The present invention provides for in-situ endpoint detection as the film is being removed, and with high detection sensitivity and extremely fast response time.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed is:

1. A method for detecting the endpoint for removal of a target film overlying a stopping film, comprising the steps of:

removing the target film by chemical-mechanical polishing, thereby generating a chemical reaction product with one of the stopping film and the target film, the chemical reaction product being contained in a slurry used in the chemical-mechanical polishing;

extracting the chemical reaction product as a gas from the slurry, where the extracting comprises
- contacting a first side of a hydrophobic membrane with the slurry,
- contacting a second side of the hydrophobic membrane with a gas stream, and
- allowing the chemical reaction product to pass through the membrane as a gas and become entrained in the gas stream;

converting the chemical reaction product present to a separate product; and monitoring the level of the separate product as the target film is removed.

2. The method of claim 1 wherein the level of separate product is monitored by using mass spectroscopy.

3. The method of claim 1 wherein the level of separate product is monitored by using resonance-enhanced multiphoton ionization spectroscopy.

4. The method of claim 1 wherein the converting step uses catalytic conversion.

5. The method of claim 1 wherein the level of separate product is monitored by using mass spectroscopy.

6. The method of claim 1 wherein the level of separate product is monitored by using resonance-enhanced multiphoton ionization spectroscopy.

7. The method of claim 1 further comprising the step of stopping the removal process when the endpoint has been reached.

8. A method for detecting the endpoint for removal of a target film overlying a stopping film, one of the target film and the stopping film including nitride, comprising the steps of:

removing the target film by chemical-mechanical polishing, thereby generating ammonia upon exposing the nitride to the process, the ammonia being contained in a slurry used in the chemical-mechanical polishing;

extracting the ammonia as a gas from the slurry, where the extracting comprises
- contacting a first side of a hydrophobic membrane with the slurry,
- contacting a second side of the hydrophobic membrane with a gas stream, and
- allowing the chemical reaction product to pass through the membrane as a gas and become entrained in the gas stream;

converting the ammonia to a separate product; and monitoring the level of the separate product as the target film is removed.

9. The method of claim 8 wherein the separate product is nitric oxide.

10. The method of claim 9 wherein the converting step uses a catalytic converter.

11. The method of claim 8 further comprising the step of stopping the removal process when the endpoint has been reached.

12. The method of claim 8 wherein the nitride is in the stopping film.

13. The method of claim 12 wherein the level of chemical reaction product increases as the target film is removed.

14. The method of claim 8 wherein the nitride is in the target film.

15. The method of claim 14 wherein the level of chemical reaction product decreases as the target film is removed.

* * * * *